United States Patent
Wei

(10) Patent No.: US 10,891,222 B2
(45) Date of Patent: Jan. 12, 2021

(54) MEMORY STORAGE DEVICE AND OPERATION METHOD THEREOF FOR IMPLEMENTING INNER PRODUCT OPERATION

(71) Applicant: MACRONIX INTERNATIONAL CO., LTD., Hsinchu (TW)

(72) Inventor: Ming-Liang Wei, Kaohsiung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 158 days.

(21) Appl. No.: 16/231,681

(22) Filed: Dec. 24, 2018

(65) Prior Publication Data

US 2020/0201751 A1 Jun. 25, 2020

(51) Int. Cl.
*G06F 12/02* (2006.01)
*G11C 14/00* (2006.01)
*G11C 11/408* (2006.01)

(52) U.S. Cl.
CPC ...... *G06F 12/0238* (2013.01); *G11C 11/4082* (2013.01); *G11C 14/0045* (2013.01)

(58) Field of Classification Search
CPC ............ G06F 12/0238; G11C 14/0045; G11C 11/4082; G11C 13/0002; G11C 7/16; G11C 11/54; G11C 7/1006
USPC ....................................................... 708/523
See application file for complete search history.

(56) References Cited

U.S. PATENT DOCUMENTS

| | | | |
|---|---|---|---|
| 2005/0125477 A1* | 6/2005 | Genov | G06N 3/0635 708/607 |
| 2017/0220526 A1* | 8/2017 | Buchanan | G06F 17/16 |
| 2019/0042949 A1* | 2/2019 | Young | G06F 30/367 |

OTHER PUBLICATIONS

Burr, G.W., et al.; "Experimental demonstration and tolerancing of a large-scale neural network (165,000 synapses using phase-change memory as the synaptic weight element;" IEEE Transactions on Electron Devices; vol. XX; No. X; 2015; pp. 1-9.

* cited by examiner

*Primary Examiner* — Tan V Mai
(74) *Attorney, Agent, or Firm* — McClure, Qualey & Rodack, LLP

(57) ABSTRACT

A memory storage device includes: a memory array for generating a cell current dependent to an input and transconductance of memory cells of the memory array; a reference array for generating a reference current; an ADC for performing analog-digital-conversion on the cell current based on the reference current to generate a digital output; and a memory controller for generating an output based on the input and the digital output of the ADC. The output of the memory controller indicates an inner product of the input and a weight, the weight including a positive weight and a negative weight. The positive weight is implemented by the transconductance of the memory cells of the memory array. The negative weight is implemented by transconductance of reference cells of the reference array or implemented by a shifting number of a shifter in the memory controller.

7 Claims, 3 Drawing Sheets

MEMORY STORAGE DEVICE AND OPERATION METHOD THEREOF FOR IMPLEMENTING INNER PRODUCT OPERATION

TECHNICAL FIELD

The disclosure relates in general to a memory storage device and an operation method thereof for implementing inner product operation, and more particularly to a non-volatile memory storage device and an operation method thereof for implementing inner product operation.

BACKGROUND

Recently, Neural Network (NN) is in fast developing. Neural Network needs a lot of product operations, for example inner product operations. In convention, data is fetched from the memory into the processor and after processed by the processer, data is moved into the memory from the processor. However, this conventional structure needs larger circuit area and is negatively affected to the parallel computing (or parallel processing).

Now, memories capable of implementing product operations are also developed. The memories may store data and implement product operations.

In now, in implementing inner product operations on memories, digital implementation or analog implementation are both developed. In conventional digital implementation, if a digital multiplier is used in inner product, then several hundreds of transistors may be used and thus the circuit cost is high.

Now, the analog implementation for inner product operations is described. In multiplication-addition operation, the multiplicand is transformed into a corresponding equivalent resistance (that is, the memory cell is used as an equivalent resistor to implement the multiplicand). Based on Ohm's law $I=V*(1/R)$, the memory cell may be used a multiplication element, and the addition is implemented by current superposition. In other words, if the memory cells are used to implement the multiplier, the input is the quantized voltage, and the transconductance (W) (or the weight) is a reciprocal of the equivalent resistance. Current is obtained by multiplying the voltage and the transconductance. Thus, the current is the result of the inner product operation.

FIG. 1 (prior art) shows to implement the inner product operation by analog implementation. As shown in FIG. 1, based on Ohm's law, the current is expressed as $I=\Sigma VG$, wherein the inputs are $X_1$ and $X_2$, and the input voltage is $V_{in1}$ and $V_{in2}$. The conversion unit 10 may convert the inputs $X_1$ and $X_2$ into the input voltages $V_{in1}$ and $V_{in2}$ ($V=\beta X$). The relationship between the transconductance G and the weight W is $G=\alpha W$, wherein $G_1$ is an equivalent transconductance of at least one memory cell and $G_2$ is also an equivalent transconductance of at least one memory cell. After converted by the sensing amplifier SA, the output Y from the sensing amplifier SA is expressed as: $Y=\Sigma XW$. By so, the inner product operations are implemented.

In analog implementation, a current subtractor is used to implement negative weights. FIG. 2 (prior art) shows implementation of negative weights by a current subtractor 20. As shown in FIG. 2, $G_1^+$ is an equivalent transconductance formed by at least one memory cell and so are $G_1^-$, $G_2^+$ and $G_2^-$. $G_1$ and $G_2$ refer to two equivalent transconductances ($G_1=G_1^+ +G_1^-$; $G_2=G_2^+ +G_2^-$). The corresponding weights may be obtained from the transconductances $G_1$ and $G_2$. But the implementation in FIG. 2 needs a high cost current subtractor and thus high cost in implementing negative weight.

SUMMARY

According to one embodiment, provided is a memory storage device for implementing inner product operations. The memory storage device includes: a memory array, for receiving an input and generating a cell current, wherein the cell current is dependent on the input and a plurality of transconductance of a plurality of memory cells of the memory array; a reference array for generating a reference current; an analog-to-digital converter (ADC) coupled to the memory array and the reference array, the ADC performing analog-digital-conversion on the cell current from the memory array based on the reference current from the reference array to generate a digital output; and a memory controller coupled to the ADC, the memory controller performing accumulation of the input to obtain an input-accumulated value, the memory controller further performing shifting on the input-accumulated value to generate a shifted input-accumulated value, the memory controller subtracting the digital output of the ADC with the shifted input-accumulated value to generate an output, wherein the output of the memory controller indicates an inner product of the input and a weight, the weight including a positive weight and a negative weight, the positive weight being implemented by the transconductance of the memory cells of the memory array, and the negative weight being implemented by a shift of a shifter of the memory controller.

According to another embodiment, provided is a memory storage device for implementing inner product operations. The memory storage device includes: a memory array, for receiving an input and generating a cell current, wherein the cell current is dependent to the input and a plurality of transconductance of a plurality of memory cells of the memory array; a memory controller for performing accumulation of the input to obtain an input-accumulated value; a reference array coupled to the memory controller, the reference array receiving the input-accumulated value from the memory controller for generating a current being dependent to the input and a plurality of transconductance of a plurality of reference cells of the reference array; and an analog-to-digital converter (ADC) coupled to the memory array and the reference array, the ADC performing analog-digital-conversion on the cell current from the memory array based on the current from the reference array to generate an output, wherein the output of the ADC indicates an inner product of the input and a weight, the weight including a positive weight and a negative weight, the positive weight being implemented by the transconductance of the memory cells of the memory array, and the negative weight being implemented by the transconductance of the reference cells of the reference array.

According to yet another embodiment, provided is an operation method for a memory storage device, the memory storage device including a memory array, a reference array, an analog-to-digital converter (ADC) and a memory controller. The operation method includes: receiving an input by the memory array to generate a cell current, wherein the cell current is dependent to the input and a plurality of transconductance of a plurality of memory cells of the memory array; generating a reference current by the reference array; performing, by the ADC, analog-digital-conversion on the cell current from the memory array based on the reference current from the reference array to generate a digital output;

and performing, by the memory controller, accumulation of the input to obtain an input-accumulated value, further performing shifting on the input-accumulated value to generate a shifted input-accumulated value, subtracting the digital output of the ADC with the shifted input-accumulated value to generate an output, wherein the output of the memory controller indicates an inner product of the input and a weight, the weight including a positive weight and a negative weight, the positive weight being implemented by the transconductance of the memory cells of the memory array, and the negative weight being implemented by a shift of a shifter of the memory controller.

According to still another embodiment, provided is an operation method for a memory storage device, the memory storage device including a memory array, a reference array, an analog-to-digital converter (ADC) and a memory controller. The operation method includes: receiving an input by the memory array to generate a cell current, wherein the cell current is dependent to the input and a plurality of transconductance of a plurality of memory cells of the memory array; performing, by the memory controller, accumulation of the input to obtain an input-accumulated value; receiving, by the reference array, the input-accumulated value from the memory controller for generating a current having a first part and a second part, the second part being dependent to the input and a plurality of transconductance of a plurality of reference cells of the reference array; and performing, by the ADC, analog-digital-conversion on the cell current from the memory array based on the current from the reference array to generate an output, wherein the output of the ADC indicates an inner product of the input and a weight, the weight including a positive weight and a negative weight, the positive weight being implemented by the transconductance of the memory cells of the memory array, and the negative weight being implemented by the transconductance of the reference cells of the reference array.

Figure 1:
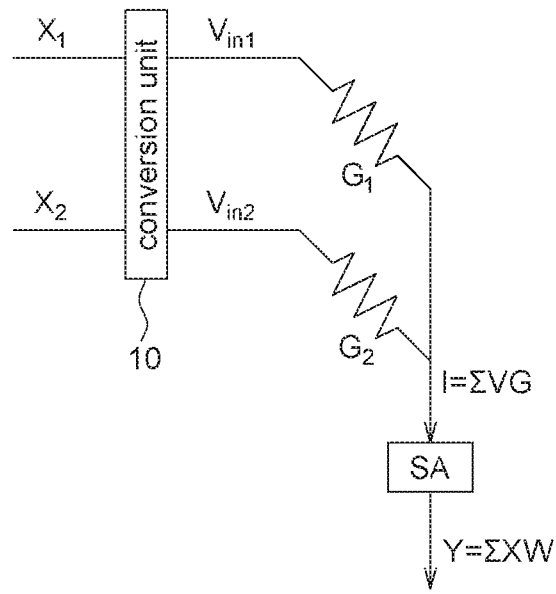
FIG. 1 (prior art) shows to implement the inner product operation by analog implementation.
Figure 2:
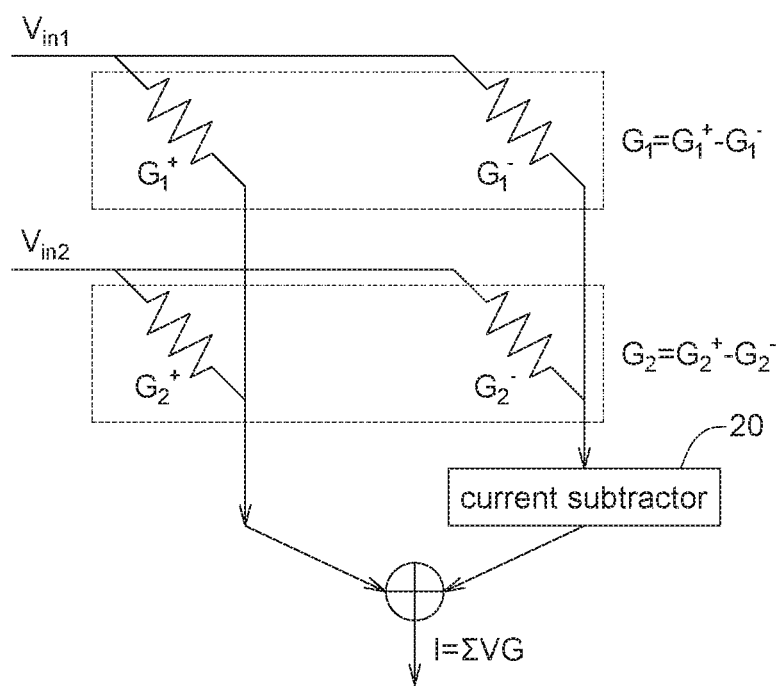
FIG. 2 (prior art) shows implementation of negative weight by a current subtractor.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DESCRIPTION OF THE EMBODIMENTS

Technical terms of the disclosure are based on general definition in the technical field of the disclosure. If the disclosure describes or explains one or some terms, definition of the terms is based on the description or explanation of the disclosure. Each of the disclosed embodiments has one or more technical features. In possible implementation, one skilled person in the art would selectively implement part or all technical features of any embodiment of the disclosure or selectively combine part or all technical features of the embodiments of the disclosure.

Figure 3:
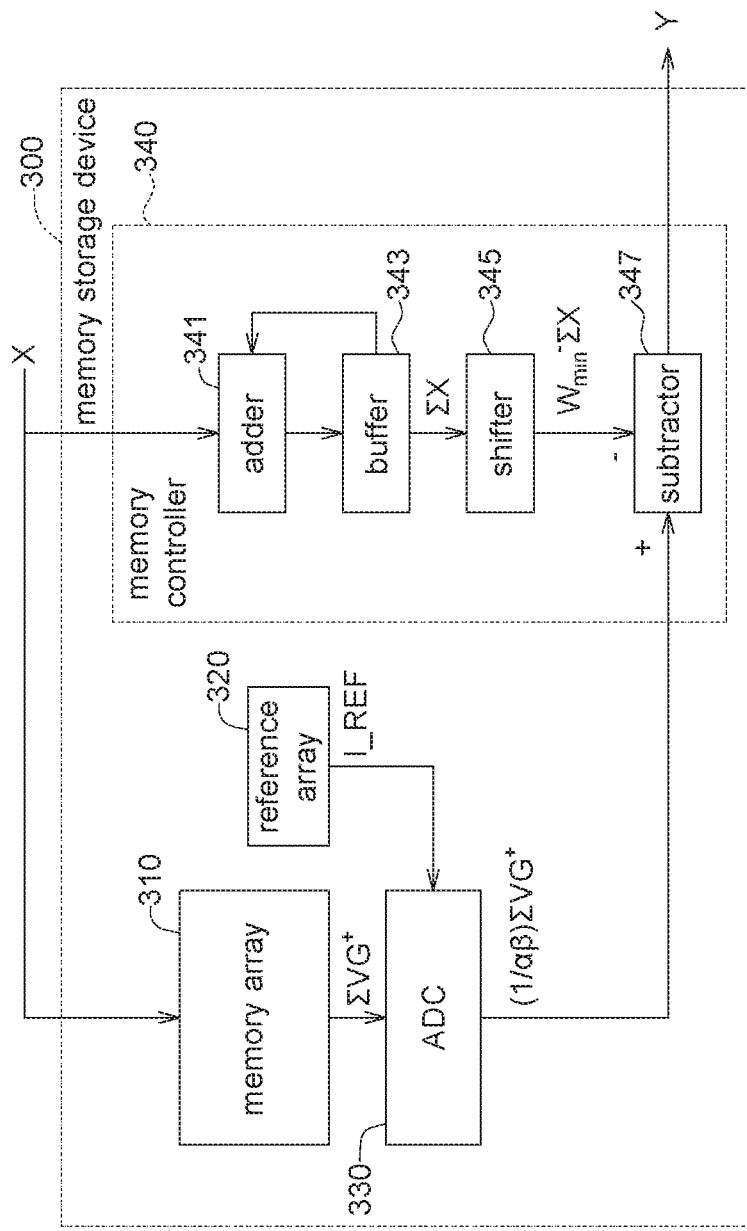
FIG. 3 shows a functional block diagram of a memory storage device according to a first embodiment of the application.

FIG. 3 shows a functional block diagram of a memory storage device according to a first embodiment of the application. As shown in FIG. 3, the memory storage device 300 includes a memory array 310, a reference array 320, an ADC (analog-to-digital converter) 330 and a memory controller 340. The memory controller 340 includes an adder 341, a buffer 343, a shifter 345 and a subtractor 347. The memory storage device 300 is for example but not limited by a non-volatile memory.

In FIG. 3, the memory storage device 300 may implement the inner product operation $Y=\Sigma WX$, wherein $G=\alpha W$ and $V=\beta X$. The relationship between the transconductance G and the weight W is expressed as $G=\alpha W$. That is, the transconductance G (which is a reciprocal of an equivalent resistance R) is $\alpha$ times of the weight W, $\alpha$ being a constant. $G=G^+ - G_{min}^-$. $G^+$ is an equivalent transconductance of at least one memory cell of the memory array 310; and $G_{min}^-$ is a self-defined constant value. $G_{min}^-$ is corresponding to a self-defined negative weight $(G_{min}^-/\alpha)$; and a logarithm of the negative weight to base 2 $(\log_2(G_{min}^-/\alpha))$ decides the shift of the shifter 345 of the memory controller 340. $V=\beta X$ refers to that input voltage V is $\beta$ times of the input X, $\beta$ being a constant.

The output Y of the memory storage device 300 is expressed as below.

$$Y=\Sigma WX=(1/\alpha\beta)\Sigma VG=(1/\alpha\beta)\Sigma V(G^+-G_{min}^-)=(1/\alpha\beta)$$
$$\Sigma VG^+-(1/\alpha\beta)\Sigma VG_{min}^-=(1/\alpha\beta)\Sigma VG^+-W_{min}^-\Sigma X.$$

wherein $W_{min}^-=(1/\beta)*G_{min}^-$ and $W=W^+-W_{min}^-$. $W^+=(1/\alpha)*G^+$ and $W_{min}^-=(1/\alpha)*G_{min}^-$. "$W^+$", a positive weight, is corresponding to the transconductance of the memory cells of the memory array 310. "$W_{min}^-$", a negative weight, is corresponding to the shift of the shifter 345, wherein the shift of the shifter 345 is corresponding to a logarithm of the negative weight $W_{min}^-$ to base 2 $(\log_2(W_{min}^-))$.

In the first embodiment of the application, the negative weight, which is self-defined, may be power of 2 (for example but not limited by, -1, -2, -4, -8). Thus, it is easy to combine into a negative weight by the shifter 345.

The input X is input into the adder 341. The output of the adder 341 is input into the buffer 343 and the output of the buffer 343 is fed back to the adder 341. By so, through the accumulation operation of the adder 341 and the buffer 343, the output of the buffer 343 is $\Sigma X$.

The output $\Sigma X$ of the buffer 343 is input into the shifter 345 and thus the shifter 345 shifts $\Sigma X$ as "$W_{min}^-\Sigma X$" (which is also referred as a shifted input-accumulated value). The output $W_{min}^-\Sigma X$ of the shifter 345 is input into the subtractor 347. If the self-defined negative weight is power of 2, then the operation of multiplying "$W_{min}^-$ by $\Sigma X$ can be implemented by a shift of the shifter 345 (i.e. the shifting result of the shifter 345 on $\Sigma X$ is "$W_{min}^-\Sigma X$".)

Further, the input X may be input into the memory array 310. The memory array 310 outputs an output current (i.e. the cell current) $\Sigma VG+$ wherein $V=\beta X$. In other words, the cell current is corresponding to the input X and the transconductance values of the memory cells of the memory array 310. The reference array 320 outputs a reference current I_REF wherein in the first embodiment of the application, the reference current I_REF is independent of the input X.

The ADC 330 is coupled to the memory array 310 and the reference array 320. The ADC 330 generates $(1/\alpha \beta)\Sigma VG^+$ based on the cell current $\Sigma VG^+$ and the reference current I_REF. In details, the ADC 330 may perform the functions of the sensing amplifier (SA) to output $(1/\alpha\beta)\Sigma VG^+$ by comparing the cell current $\Sigma V\,G^+$ and the reference current I_REF. Or, the input voltage V and the transconductance $G^+$ are analog values while the weight W and the input V are digital values. $\Sigma V\,G^+$ is also an analog value. The ADC 330 performs ADC to convert the analog value $\Sigma VG^+$ into the digital value $(1/\alpha\beta)\Sigma VG^+$.

The memory controller 340 is coupled to the ADC 330. The output $(1/\alpha\beta)\Sigma VG^+$ of the ADC 330 is input into the subtractor 347 of the memory controller 340. The subtractor 347 subtracts $(1/\alpha\beta)\Sigma VG^+$ and $W_{min}^-\Sigma X$ to output the output Y ($Y=(1/\alpha\beta)\Sigma VG^+-W_{min}^-\Sigma X$). By so, the memory storage device 300 of the first embodiment of the application implements the inner product operation (a kind of AI operations).

From the above description, in the first embodiment of the application, in implementing the negative weight, a digital subtractor having small circuit area is used, instead of using an analog subtractor having large circuit area. Thus, the first embodiment of the application has advantages in small circuit area and low power consumption.

Figure 4:
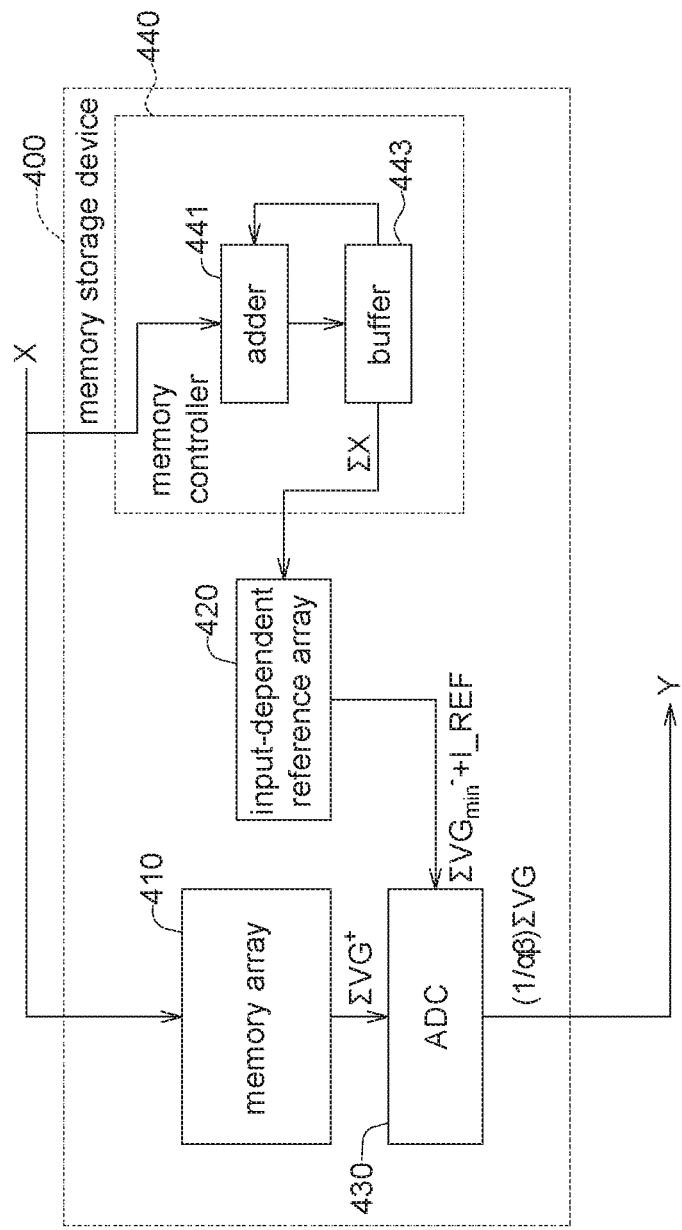
FIG. 4 shows a functional block diagram of a memory storage device according to a second embodiment of the application.

FIG. 4 shows a functional block diagram of a memory storage device according to a second embodiment of the application. As shown in FIG. 4, the memory storage device 400 includes a memory array 410, an input-dependent reference array 420, an ADC 430 and a memory controller 440. The memory controller 440 includes an adder 441 and a buffer 443. The memory storage device 400 is for example but not limited by, a non-volatile memory device. The input-dependent reference array 420 is coupled to the memory controller 440. The memory array 410 and the input-dependent reference array 420 are coupled to the ADC 430.

In FIG. 4, the memory storage device 400 may implement the inner produce operation $Y=\Sigma WX$.

The output Y of the memory storage device 400 is expressed as below.

$$Y = (1/\alpha\beta)\sum VG = (1/\alpha\beta)\sum V(G^+ - G_{min}^-) =$$
$$(1/\alpha\beta)\{\sum VG^+ - \sum VG_{min}^-\} = (1/\alpha\beta)\{\sum VG^+ - G_{min}^-\sum V\}.$$

The operations of the adder 441 and the buffer 443 are similar to those of the adder 341 and the buffer 343 in FIG. 3 and thus are omitted here.

The output $\Sigma X$ of the buffer 443 is input to the input-dependent reference array 420. In the second embodiment of the application, the transconductance of the reference cells of the input-dependent reference array 420 is also constant or fixed, for implementing the negative weight. Further, the output current of the input-dependent reference array 420 may include two parts, one part being the reference current I_REF (which is independent of the input X) and the other part being $\Sigma VG_{min}^-$ (which is dependent to the input X and the transconductance of the reference cells).

Further, the input X may be input to the memory array 410 and thus the memory array 410 outputs an output current (i.e. the cell current) $\Sigma VG^-$, wherein $V=\beta X$.

The ADC 430 outputs $(1/\alpha\beta)\Sigma VG$ based on $\Sigma VG^+$ and "I_REF+$\Sigma VG_{min}^-$". In details, the ADC 430 may perform the sensing amplifier (SA) function to compare $\Sigma VG^+$ and "I_REF+$\Sigma VG_{min}^-$" to output $(1/\alpha\beta)\Sigma VG$. By so, the ADC 430 may generate the output $Y=(1/\alpha\beta)\{\Sigma VG^+-G_{min}^-\Sigma V\}$.

In the second embodiment of the application, in order to eliminate the subtractor, a part of the output current from the input-dependent reference array 420 is dependent to the input X. The reason is that, as for the output of the ADC 430, the ADC 430 compares $\Sigma VG^+$ and "I_REF+$\Sigma VG_{min}^-$" to output $(1/\alpha\beta)\Sigma VG$. However, in another case that the ADC 430 compares "$\Sigma VG^+-\Sigma VG_{min}^-$" and "I_REF" to output another output Y' (in this case, the memory storage device may need a subtractor to generate the term "$\Sigma VG^+-\Sigma VG_{min}^-$"), wherein Y' is equivalent to $Y=(1/\alpha\beta)\Sigma VG$ (that is Y' is equivalent to Y, but implementation of Y and Y' are not the same). Thus, in the second embodiment of the application, by introducing the input-dependent reference array 420, the subtractor may be eliminated. Thus, the memory controller 440 and of course the memory storage device 400 have small circuit area. By this, the memory storage device 400 of the second embodiment of the application may implement the inner product operation (i.e. AI operations).

From the above description, in the second embodiment of the application, in implementing the negative weight, an analog subtractor having large circuit area is eliminated. Thus, the second embodiment of the application has advantages in small circuit area and low power consumption.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A memory storage device for implementing inner product operations, the memory storage device including:
   a memory array, for receiving an input and generating a cell current, wherein the cell current is dependent to the input and a plurality of transconductance of a plurality of memory cells of the memory array;
   a memory controller for performing accumulation of the input to obtain an input-accumulated value;
   a reference array coupled to the memory controller, the reference array receiving the input-accumulated value from the memory controller for generating a current being dependent to the input and a plurality of transconductance of a plurality of reference cells of the reference array; and
   an analog-to-digital converter (ADC) coupled to the memory array and the reference array, the ADC performing analog-digital-conversion on the cell current from the memory array based on the current from the reference array to generate an output,
   wherein the output of the ADC indicates an inner product of the input and a weight, the weight including a positive weight and a negative weight, the positive weight being implemented by the transconductance of the memory cells of the memory array, and the negative weight being implemented by the transconductance of the reference cells of the reference array.

2. The memory storage device according to claim 1, wherein the memory controller includes:
   an adder and a buffer, the adder receiving the input and an output of the adder being input to the buffer, an output of the buffer being fed back to the adder, the output of the buffer being the input-accumulated value.

3. The memory storage device according to claim 1, wherein the transconductance of the reference cells of the reference array is constant.

4. The memory storage device according to claim 1, wherein a first part of the current generated by the reference array is independent of the input; and a second part of the current generated by the reference array is being dependent to the input and the plurality of transconductance of the plurality of reference cells of the reference array.

5. An operation method for a memory storage device, the memory storage device including a memory array, a reference array, an analog-to-digital converter (ADC) and a memory controller, the operation method including:
    receiving an input by the memory array to generate a cell current, wherein the cell current is dependent to the input and a plurality of transconductance of a plurality of memory cells of the memory array;
    performing, by the memory controller, accumulation of the input to obtain an input-accumulated value;
    receiving, by the reference array, the input-accumulated value from the memory controller for generating a current being dependent to the input and a plurality of transconductance of a plurality of reference cells of the reference array; and
    performing, by the ADC, analog-digital-conversion on the cell current from the memory array based on the current from the reference array to generate an output,
    wherein the output of the ADC indicates an inner product of the input and a weight, the weight including a positive weight and a negative weight, the positive weight being implemented by the transconductance of the memory cells of the memory array, and the negative weight being implemented by the transconductance of the reference cells of the reference array.

6. The operation method according to claim 5, wherein the transconductance of the reference cells of the reference array is constant.

7. The operation method according to claim 5, wherein a first part of the current generated by the reference array is independent of the input; and a second part of the current generated by the reference array is being dependent to the input and the plurality of transconductance of the plurality of reference cells of the reference array.

\* \* \* \* \*